United States Patent
Kuo et al.

(10) Patent No.: US 9,891,273 B2
(45) Date of Patent: Feb. 13, 2018

(54) TEST STRUCTURES AND TESTING METHODS FOR SEMICONDUCTOR DEVICES

(75) Inventors: Yung-Hsin Kuo, Zhubei (TW); Wensen Hung, Zhubei (TW); Po-Shi Yao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 881 days.

(21) Appl. No.: 13/172,432

(22) Filed: Jun. 29, 2011

(65) Prior Publication Data
US 2013/0002282 A1    Jan. 3, 2013

(51) Int. Cl.
G01R 31/26    (2014.01)
G01R 31/28    (2006.01)
G01R 1/073    (2006.01)

(52) U.S. Cl.
CPC ..... *G01R 31/2889* (2013.01); *G01R 1/07371* (2013.01)

(58) Field of Classification Search
CPC .. G01R 3/00; G01R 1/06755; G01R 1/06738; G01R 1/07371; G01R 31/2889
See application file for complete search history.

(56) References Cited

U.S. PATENT DOCUMENTS

| | | | |
|---|---|---|---|
| 5,525,911 A * | 6/1996 | Marumo | G01R 1/06711 324/750.25 |
| 6,356,090 B2 * | 3/2002 | Deshayes | G01R 1/07342 324/756.03 |
| 7,180,316 B1 * | 2/2007 | Ismail | G01R 1/07307 324/756.03 |
| 7,400,156 B2 * | 7/2008 | Wu | G01R 1/07357 324/750.21 |
| 7,688,085 B2 | 3/2010 | Gritters | |
| 2004/0051546 A1 * | 3/2004 | Thiessen | G01R 1/07307 324/755.11 |
| 2005/0062492 A1 * | 3/2005 | Beaman et al. | 324/765 |

(Continued)

FOREIGN PATENT DOCUMENTS

| | | |
|---|---|---|
| CN | 2781565 | 5/2006 |
| JP | 095355 | 1/1997 |

(Continued)

OTHER PUBLICATIONS

Shin-Etsu Polymer Co., Ltd., Connector Division, Integrated Circuit Mounting, http://www.shinpoly.co.ip/business/connector/products_e/gx12.html?applicc, © 2005, 2 pages.

(Continued)

*Primary Examiner* — Son Le
*Assistant Examiner* — Adam Clarke
(74) *Attorney, Agent, or Firm* — Slater Matsil, LLP

(57) ABSTRACT

Test structures, methods of manufacturing thereof, and testing methods for semiconductors are disclosed. In one embodiment, a test structure for semiconductor devices includes a printed circuit board (PCB), a probe region, and a compliance mechanism disposed between the PCB and the probe region. A plurality of wires is coupled between the PCB and the probe region. End portions of the plurality of wires proximate the probe region are an integral part of the probe region.

20 Claims, 7 Drawing Sheets

(56) References Cited

U.S. PATENT DOCUMENTS

| | | | |
|---|---|---|---|
| 2007/0013390 A1* | 1/2007 | Kuitani | G01R 1/07342 |
| | | | 324/756.03 |
| 2007/0152689 A1 | 7/2007 | Lee et al. | |
| 2007/0216432 A1* | 9/2007 | Kister | 324/755 |
| 2007/0296433 A1* | 12/2007 | Gritters | 324/757 |
| 2008/0054918 A1* | 3/2008 | Lin et al. | 324/754 |
| 2008/0094093 A1* | 4/2008 | Hsu et al. | 324/765 |
| 2010/0001748 A1* | 1/2010 | Sasaki et al. | 324/754 |
| 2010/0009471 A1* | 1/2010 | Mizoguchi | G01R 1/07378 |
| | | | 438/15 |
| 2010/0026331 A1* | 2/2010 | Chong et al. | 324/757 |
| 2010/0117673 A1* | 5/2010 | Lee et al. | 324/761 |
| 2010/0210122 A1* | 8/2010 | Hasegawa | G01R 31/2887 |
| | | | 439/78 |
| 2012/0194210 A1* | 8/2012 | Kuo et al. | 324/754.07 |

FOREIGN PATENT DOCUMENTS

| | | |
|---|---|---|
| JP | 2002042922 | 2/2002 |
| KR | 10-2009-0018675 A | 2/2009 |

OTHER PUBLICATIONS

Wikipedia, "Through-silicon via", http://en.wikipedia.org/wiki/Through-silicon_via, Jun. 24, 2011, 2 pages.

* cited by examiner

TEST STRUCTURES AND TESTING METHODS FOR SEMICONDUCTOR DEVICES

BACKGROUND

In the process of manufacturing integrated circuits and semiconductor devices, electrical and other functional testing is often performed at various stages during the manufacturing process. Probe cards are one type of test structure used to perform electrical tests. The probe cards make contact to certain areas of integrated circuits, usually to contact pads or solder bumps, during the testing process.

The semiconductor industry trends towards miniaturization of semiconductor devices and device circuitry, which results not only in smaller integrated circuits or chips, but also in reduced power consumption and faster circuit speeds. Semiconductor devices with very small array pads or solder bump configurations are currently used for many applications. As semiconductor devices decrease in size, it becomes more difficult to perform electrical tests because of the smaller pitch or spacing between contacts on the die. The assembly and manufacturing process of conventional probe cards presents several problems and is prone to errors, due to the small scale of the wiring and array pitch. Guide plate manufacturing, guide plate assembly, and probe handling damage due to the extremely weak probe structures for fine pitch applications are just a few of the problems faced by conventional probe cards.

SUMMARY

These and other problems are generally solved or circumvented, and technical advantages are generally achieved, by embodiments of the present disclosure which provide novel test structures, methods of manufacturing thereof, and testing methods for semiconductors.

In one embodiment, a test structure for semiconductor devices includes a printed circuit board (PCB), a probe region, and a compliance mechanism disposed between the PCB and the probe region. A plurality of wires is coupled between the PCB and the probe region. End portions of the plurality of wires proximate the probe region are an integral part of the probe region.

The foregoing has outlined rather broadly the features and technical advantages of embodiments of the present disclosure in order that the detailed description of the disclosure that follows may be better understood. Additional features and advantages of embodiments of the disclosure will be described hereinafter, which form the subject of the claims of the disclosure. It should be appreciated by those skilled in the art that the conception and specific embodiments disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure achieve technical advantages by providing novel test structures adapted to test semiconductor devices and integrated circuits. The test structures include a built-in probe region in which the wiring structure is an integral part of the probe region of the test structures. The novel test structures do not require a separate probe head and are capable of probing semiconductor devices with fine pitch arrays. The test structures employ compliance buffering at a space transformer plate and include fan-in wiring extensions as probe tips, in some embodiments.

The present disclosure will be described with respect to embodiments in a specific context, namely test structures 240/340/440/540/640 for semiconductor devices 210 such as integrated circuits. The disclosure may also be applied, however, to other applications and types of semiconductor devices.

Figure 1:
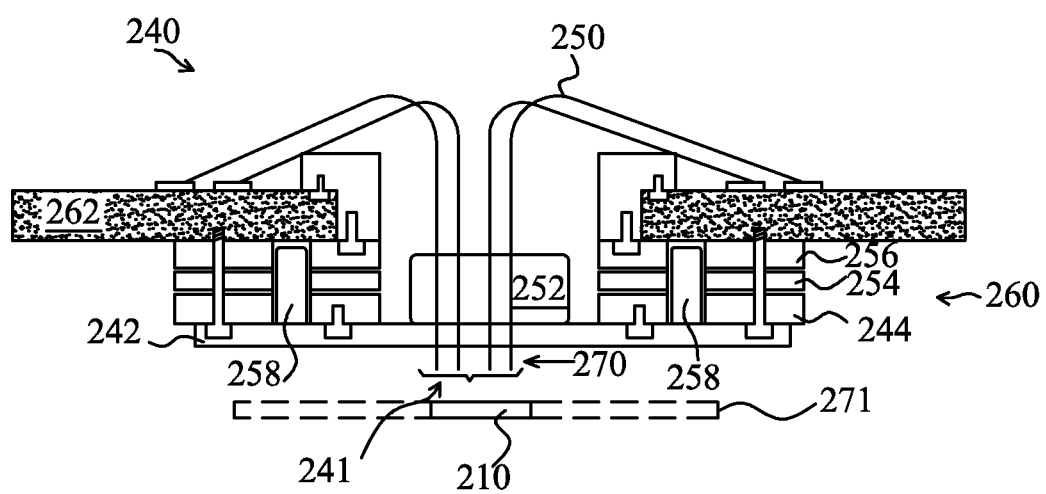
FIG. 1 is a cross-sectional view of a novel test structure having a compliance mechanism comprising an elastomer plate in accordance with a first embodiment of the present disclosure.

With reference now to FIG. 1, there is shown a cross-sectional view of a novel test structure 240 having a compliance mechanism 260 comprising an elastomer plate 254 in accordance with a first embodiment of the present disclosure. The test structure 240 includes a printed circuit board (PCB) 262 and a probe region 241. The compliance mechanism 260 is disposed between the PCB 262 and the probe region 241. A plurality of wires 250 is coupled between the PCB 262 and the probe region 241. End portions of the plurality of wires 250 proximate the probe region 241 comprise an integral part of the probe region 241.

A separate probe head is not required for the novel test structure 240. Rather, end portions of the plurality of wires 250 are routed through a space transformer (ST) plate 242 and later are shortened to form probe tips 270 of the probe region 241. An adhesive 252 is applied over the plurality of wires 250 in the ST plate 242 to partially but not completely fill central portions of the ST plate 242 and central portions of at least a first plate 244. The elastomer plate 254 comprising the compliance mechanism 260 is disposed between the first plate 244 and a second plate 256. A plurality of guide pins 258 are disposed within through-holes in the first plate 244, second plate 256, and elastomer plate 254. The guide pins 258 provide alignment of the PCB 262 and the ST plate 242 during testing of a semiconductor device 210.

A single semiconductor device 210 may be tested with the novel test structure 240 in accordance with embodiments of the present disclosure. The single semiconductor device 210 may comprise a single die of a semiconductor wafer 271 (shown in phantom in FIG. 2). The semiconductor device 210 may be tested either before or after singulating a plurality of die from the semiconductor wafer 271. Alternatively, the test structure 240 may be used to simultaneously test two or more die of a semiconductor wafer, e.g., before or after singulating die from the wafer.

Figure 2:
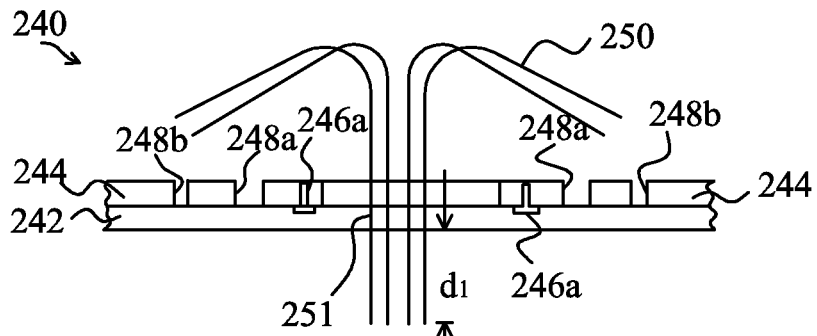
FIGS. 2 through 5 illustrate cross-sectional views of the novel test structure of FIG. 2 at various stages of the manufacturing process.

An example of a manufacturing process for the test structure 240 will next be described with reference to FIGS. 2 through 5, which illustrate cross-sectional views of the novel test structure 240 of FIG. 1 at various stages of the manufacturing process. First, a space transformer (ST) plate 242 is provided, as shown in FIG. 2. The ST plate 242 may comprise a ceramic material and may comprise a thickness of about 500 to 800 µm, as examples, although alternatively, the ST plate 242 may comprise other materials and dimensions. The ST plate 242 includes a plurality of holes 251 through which wires 250 may be routed. The plurality of holes 251 may comprise a pattern substantially similar to the pattern of contact pads on a semiconductor device 210 to be tested in some embodiments, for example.

A first plate 244 is mounted to the ST plate 242 using an attachment means 246a which may comprise screws or other fasteners. The first plate 244 may comprise a metal such as stainless steel, aluminum, or other materials, for example. The first plate 244 may comprise a thickness of about 1 to 2 mm in some embodiments, as an example, although alternatively, the first plate 244 may comprise other dimensions. The first plate 244 includes a plurality of through-holes 248a for guide pins 258 (not shown in FIG. 2; see FIG. 5). The first plate 244 also includes a plurality of through-holes 248b for accommodating attachment means 246b (also not shown in FIG. 2; see FIG. 5).

Wires 250 are inserted into holes 251 through the top side of the ST plate 242, as shown in FIG. 2. The wires 250 may comprise copper, tungsten, other conductive materials, or combinations thereof, as examples. The wires 250 may comprise a thickness of about 25 to 75 µm, for example. Alternatively, the wires 250 may comprise other materials and dimensions. The wires 250 are inserted to extend a distance comprising dimension $d_1$ from the lower side of the ST plate 242. Dimension $d_1$ may comprise about 300 to 500 µm, as examples, although alternatively, dimension $d_1$ may comprise other values.

Figure 3:
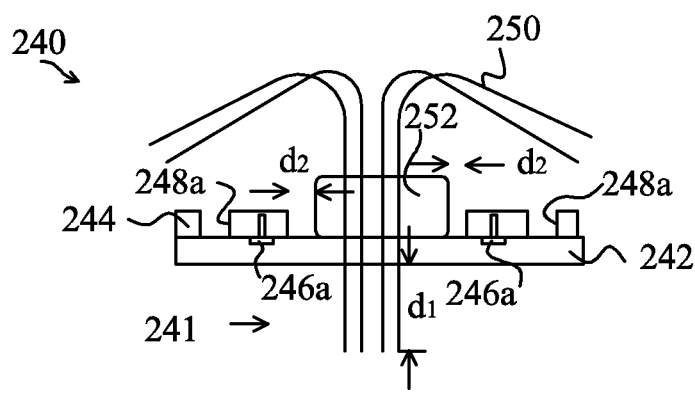

An adhesive 252 is applied over the wires 250 in the central region of the ST plate 242, as shown in FIG. 3. The adhesive 252 is applied in a region over the wires 250, yet the adhesive 252 does not completely fill a central region of the first plate 244. Rather, the adhesive 252 is spaced apart from the first plate 244 by a distance comprising dimension $d_2$ of about 50 µm, or in some embodiments, dimension $d_2$ may comprise about 15 to 100 µm. The adhesive may comprise an epoxy that is liquid when applied and curable into a solid by ultraviolet (UV) light, as an example.

Spacing the adhesive 252 away from the first plate 244 and other portions of the test structure 240 allows the test structure 240 to have more compliance and to move vertically, up and down in the figures as shown, during the testing process. The adhesive 252 is adapted to adhere the wires 250 to the ST plate 242 and form a probe region 241 of the test structure 240. In some embodiments, applying the adhesive 252 comprises applying the adhesive 252 to a central region of the ST plate 242 within an aperture in the first plate 244, wherein the adhesive does not contact the first plate 244, for example.

Figure 4:
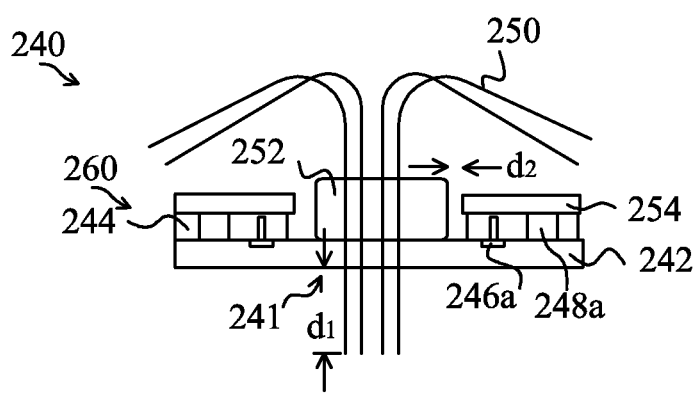

A compliance mechanism 260 comprising an elastomer plate 254 is formed over the first plate 244, as shown in FIG. 4. The elastomer plate 254 comprises a compliant material such as an elastic polymer or rubber, as examples. The elastomer plate 254 may comprise a compliant sheet of material such as silicon, rubber, or other compressible material. The elastomer plate 254 may comprise a thickness of about 2 mm and in some embodiments may comprise a thickness of about 1 to 3 mm, as examples. Alternatively, the elastomer plate 254 may comprise other materials and dimensions.

Figure 5:
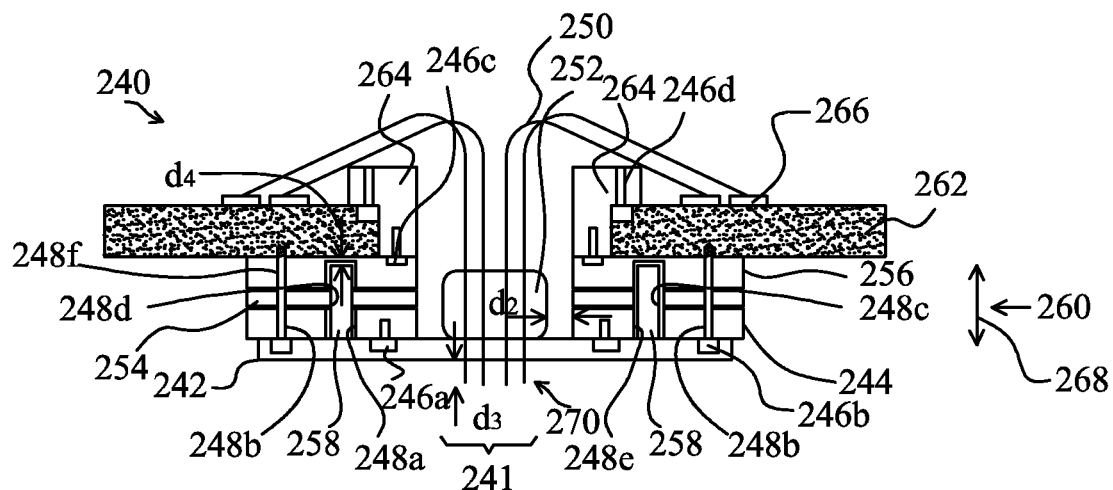

A second plate 256 is formed over the elastomer plate 254, as shown in FIG. 5. The second plate 256 may comprise similar materials and dimensions as described for the first plate 244. A printed circuit board (PCB) 262 is coupled to the ST plate 242 by attachment means 246b through through-holes 248b in the first plate 244, through-holes 248c in the compliance mechanism 260 comprising the elastomer plate 254, and through-holes 248f in the second plate 256. The attachment means 246b may comprise screws, rivets, or other fasteners.

A fix ring 264 is coupled to the test structure 240. The fix ring 264 may be circular and may comprise stainless steel coated with an insulative film such as Mylar. The fix ring 264 may be attached to the PCB 262 by attachment means 246d and to the second plate 256 by attachment means 246c, as shown in FIG. 5. The attachment means 246c and 246d may comprise screws or other fasteners, as examples. The ends of the wires 250 protruding from the adhesive 252 are attached, e.g., soldered, to bond pads 266 on the PCB 262. The other ends of the wires 250 are shortened, e.g., by a grinding or sanding process, to form probe tips 270 in probe region 241. The length of the wires 250 that comprise the probe tips 270 have a dimension $d_3$ after the grinding process. Dimension $d_3$ may comprise about 50 µm, although alternatively, dimension $d_3$ may comprise other values.

Advantageously, the wires 250 that extend through the ST plate 242 function as a wiring extension probe structure or probe tips 270.

The test structure 240 includes a plurality of guide pins 258 that extend through through-holes 248a in the first plate 244, through-holes 248d in the compliance mechanism 260 comprising the elastomer plate 254, and through-holes 248e in the second plate 256. The guide pins 258 may comprise steel and may be about 1 to 2 mm in thickness and about 10 to 20 mm long, e.g., in a vertical direction as shown in the figures. The guide pins 258 are coupled to the ST plate 242. When the test structure 240 is not in use, the guide pins 258 are spaced apart from the PCB 262 by a distance comprising dimension $d_4$. Dimension $d_4$ may comprise about 100 μm, as an example, although alternatively, dimension $d_4$ may comprise other values. The guide pins 258 allow vertical float or compliance in a perpendicular direction to a semiconductor device (see device 210 in FIG. 1) under test, while keeping the test structure 240 and probe region 241 in alignment with the semiconductor device 210 under test.

The compliance mechanism 260 comprising the elastomer plate 254 is pliable and provides compliance 268 in a vertical direction, e.g., to a semiconductor device 210 being tested. Because the adhesive 252 does not completely fill the central region of the test structure 240 but is spaced apart from at least the first plate 244 by a dimension $d_2$, further vertical movement and compliance 268 is provided. The guide pins 258 further provide vertical movement and compliance 268, and establish a predetermined amount of compliance 268 for the test structure 240 while also providing alignment within the test structure 240 and alignment to semiconductor devices 210 during a testing process.

Figure 6:
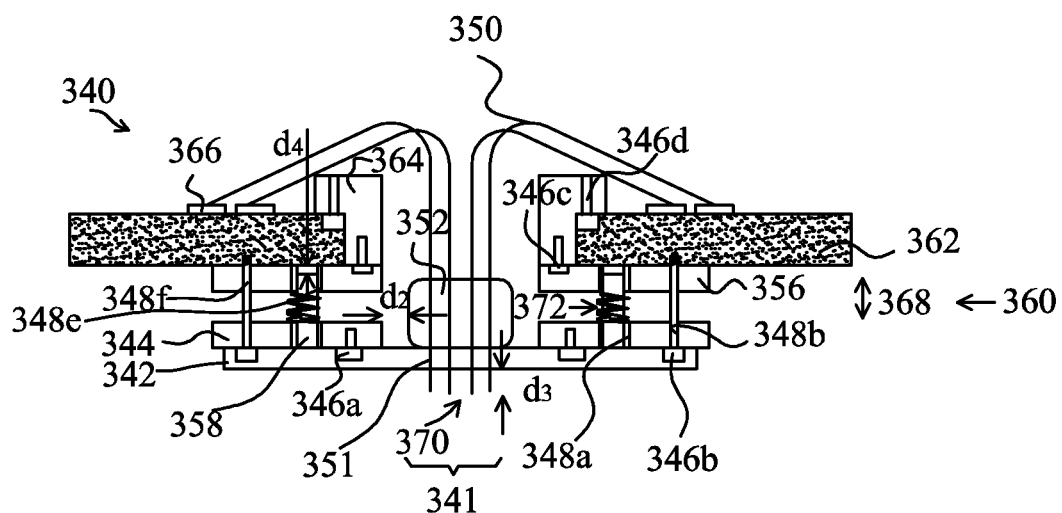
FIG. 6 shows a cross-sectional view of a test structure with a compliance mechanism comprising a plurality of springs in accordance with a second embodiment of the present disclosure.

FIG. 6 shows a cross-sectional view of a test structure 340 with a compliance mechanism 360 comprising a plurality of springs 372 in accordance with a second embodiment of the present disclosure. Like numerals are used for the various elements in FIG. 6 that were used to describe FIGS. 1 through 5. To avoid repetition, each reference number shown in FIG. 6 is not described again in detail herein. Rather, similar materials x40, x42, x44, etc. are used to describe the various material layers and components shown as were used to describe FIGS. 1 through 5, where x=2 in FIGS. 1 through 5 and x=3 in FIG. 6.

The test structure 340 of FIG. 6 includes a plurality of springs 372 that comprise the compliance mechanism 360 in this embodiment. The test structure 340 may include two, three, or more springs 372, as an example, although alternatively, the test structure 340 may include more springs 372 that provide the compliance 368 for the test structure 340. The springs 372 may comprise a variety of shapes, as shown in FIGS. 7A through 7E. The springs 372 may be disposed proximate, e.g., around the guide pins 358, as shown in FIG. 6.

Figures 7A, 7B:
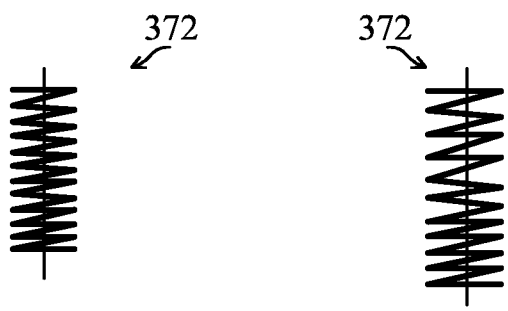
FIGS. 7A through 7E show some examples of types of springs that may be used for the compliance mechanism of the embodiment shown in FIG. 6.
Figures 7C, 7D:
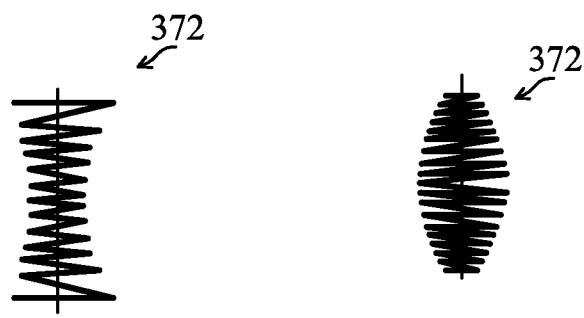
Figure 7E:
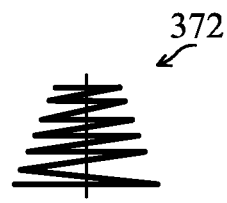

FIGS. 7A through 7E show examples of types or shapes of springs 372 that may be used for the compliance mechanism 360 of the embodiment shown in FIG. 6. The springs 372 may comprise a uniform or constant pitch, as shown in FIG. 7A in a cross-sectional view. The springs 372 may alternatively comprise a variable pitch, as shown in FIG. 7B. The springs 372 of the test structure 340 may also comprise an hourglass shape, as shown in FIG. 7C, a barrel shape, as shown in FIG. 7D, or a conical shape, as shown in FIG. 7E, as examples. The springs 372 may comprise round or rectangular wire, and may comprise a combination of the shapes and configurations shown. The springs 372 provide helical compression and provide compliance 368 in a vertical direction for the test structure 340.

Figure 8:
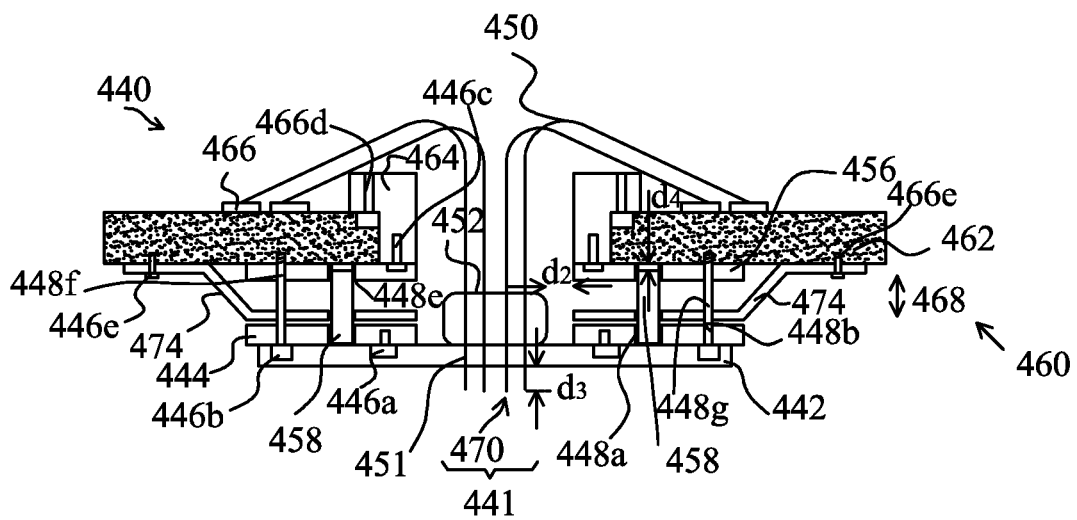
FIG. 8 is a cross-sectional view of a test structure having a compliance mechanism comprising a stiffness controllable frame structure in accordance with a third embodiment of the present disclosure.
Figure 9:
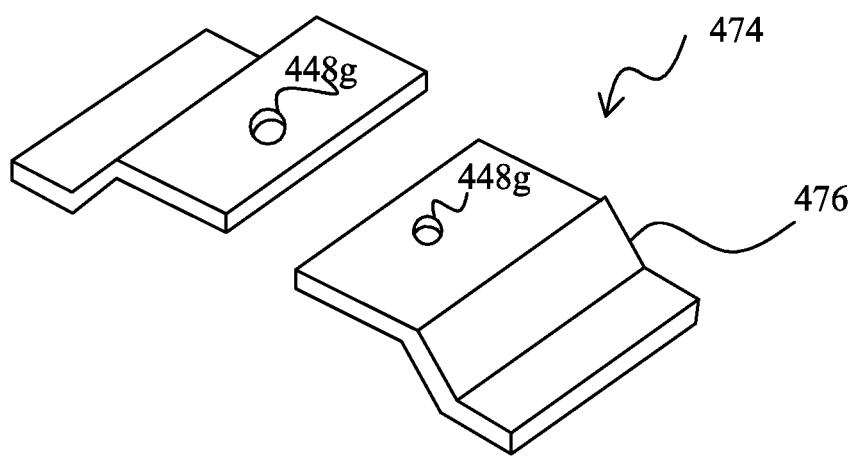
FIG. 9 shows a perspective view of the stiffness controllable frame structure of the embodiment shown in FIG. 8.

FIG. 8 is a cross-sectional view of a test structure 440 having a compliance mechanism 460 comprising a stiffness controllable frame structure 474 in accordance with a third embodiment of the present disclosure. FIG. 9 shows a perspective view of a portion of the stiffness controllable frame structure 474 of the embodiment shown in FIG. 8. Again, like numerals are used for the various elements in FIGS. 8 and 9 that were used to describe the previous figures, and to avoid repetition, each reference number shown in FIGS. 8 and 9 is not described again in detail herein.

The stiffness controllable frame structure 474 may comprise a metal such as stainless steel, aluminum, or other materials and may include an angled portion 476 that contributes to the mechanical compliance 468 for the test structure 440. The stiffness controllable frame structure 474 may comprise a thickness of about 2 to 3 mm, as an example. The stiffness controllable frame structure 474 includes through-holes 448g through which the guide pins 458 and/or attachment means 446b may pass through. The stiffness controllable frame structure 474 may be substantially round, square, or rectangular in a top view, not shown. The stiffness controllable frame structure 474 may be attached to the PCB 462 by attachment means 446e which may comprise screws or other fasteners. The stiffness controllable frame structure 474 functions as an elastic frame for the test structure 440, providing compliance 468 in a vertical direction during testing of a semiconductor device 210 (see FIG. 1).

Figure 10:
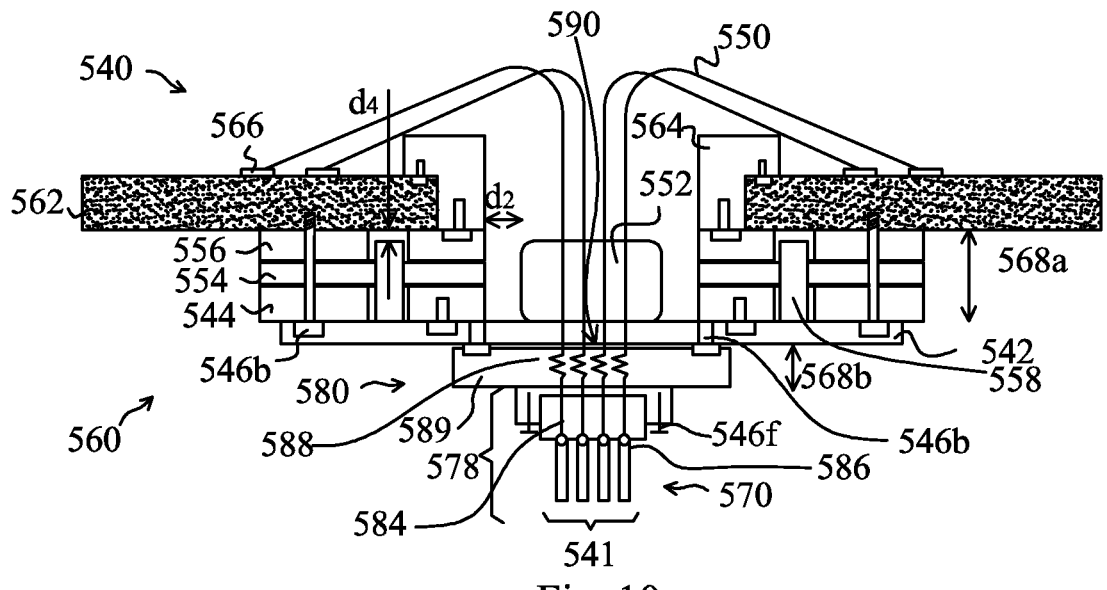
FIG. 10 illustrates a cross-sectional view of a test structure in accordance with a fourth embodiment of the present disclosure, wherein a probe region includes a micro-electromechanical system (MEMS) rigid probe device coupled to ends of a plurality of wires of the test structure through an interposer.

FIG. 10 illustrates a cross-sectional view of a test structure 540 in accordance with a fourth embodiment of the present disclosure, wherein the probe region 541 of the test structure 540 includes a micro-electromechanical system (MEMS) rigid probe device 578 coupled to ends of the plurality of wires 550 of the test structure 540 through an interposer 580. FIGS. 11 through 15 show cross-sectional views of a method of manufacturing the MEMS rigid probe device 578 of FIG. 10 in accordance with an embodiment of the present disclosure using a wire electrical discharge machining (WEDM) process.

Figure 11:
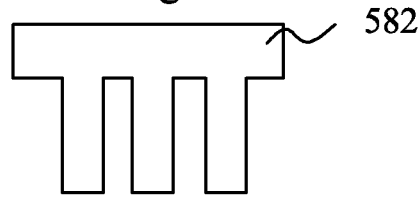
FIGS. 11 through 15 show cross-sectional views of a method of manufacturing the MEMS rigid probe of FIG. 10 in accordance with an embodiment of the present disclosure using a wire electrical discharge machining (WEDM) process.
Figure 12:
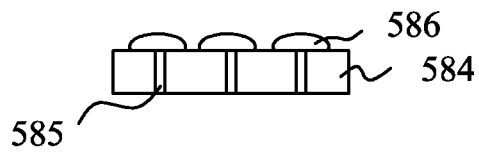
Figure 13:
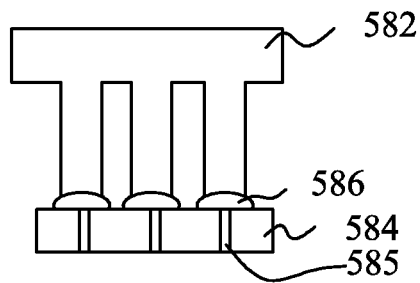
Figure 14:
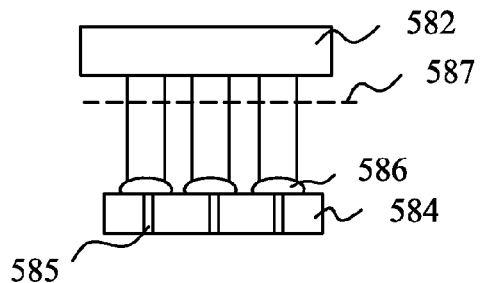
Figure 15:
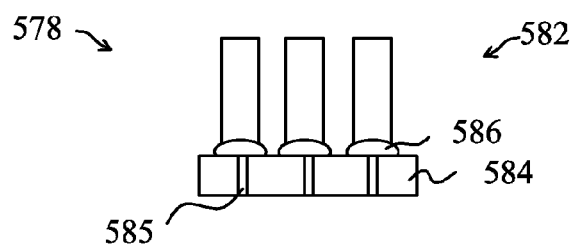

In this embodiment, first, the probe article 582 is manufactured using WEDM, as shown in FIG. 11. The probe article 582 may comprise a plurality of tungsten pillars that may have dimensions of about 20 μm×20 μm on a pitch of about 45 μm, as examples, although alternatively, the probe article 582 may comprise other materials and dimensions. A substrate 584 is provided, as shown in FIG. 12. The substrate 584 may comprise a ceramic or organic material and may comprise a thickness of about 3 mm. The substrate 584 includes through vias 585 and solder bumps 586 disposed thereon. The probe article 582 is bonded to the solder bumps 586 on the substrate 584, as shown in FIG. 13. The probe article 582 is cut at a cut line 587, as shown in FIG. 14, to remove a base portion of the probe article 582, leaving the MEMS rigid probe device 578 shown in FIG. 15.

Referring again to FIG. 10, the interposer 580 includes a pliable member 589 comprising about 1 to 2 mm of silicon rubber or other materials, and a plurality of conductive springs 588 disposed within the pliable member 589. The interposer 580 may comprise a GX12 type of commercially available interposer having a pitch of 50 μm or less manufactured by Shin Etsu Polymer Co., Ltd., as one example, although alternatively, other interposers 580 may be used. The conductive springs 588 may comprise tungsten wire or other conductive materials, for example. The through vias 585 (see FIG. 13) of the MEMS rigid probe device 578 are bonded to the conductive springs 588 of the interposer 580. The other side of the conductive springs 588 of the interposer 580 are connected in region 590 to the ends of the wires 550 protruding from the ST plate 542, shown in FIG. 10. The MEMS rigid probe device 578 is coupled to the interposer 580 using attachment means 546f which may comprise screws or other fasteners. The interposer 580 is coupled to the ST plate 542 using attachment means 546g which also may comprise screws or other fasteners.

The compliance mechanism 560 is shown in the embodiment of FIG. 10 as an elastomer plate 554; however, alternatively, the compliance mechanism 560 may alternatively comprise a spring 372 as shown in FIG. 6 or a stiffness controllable frame structure 474 as shown in FIG. 8. Note that in this embodiment, a portion 568a of the compliance is provided by the compliance mechanism 560, e.g., the elastomer plate 554 (or springs 372 or stiffness controllable frame structure 474), and also a portion 568b of the compliance is provided by the interposer 580 which may comprise a pliable material and may provide some additional vertical mechanical compliance for the test device 540.

Figure 16:
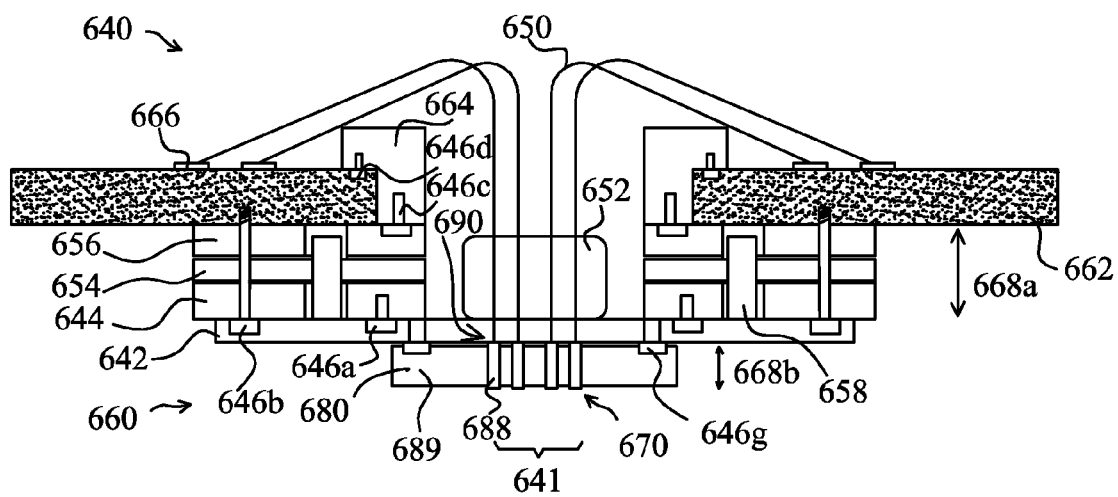
FIG. 16 shows a cross-sectional view of a test structure in accordance with a fifth embodiment of the present disclosure, wherein a probe region includes an interposer coupled to ends of a plurality of wires of the test structure.

FIG. 16 shows a cross-sectional view of a test structure 640 in accordance with a fifth embodiment of the present disclosure, wherein the probe region 641 includes an interposer 680 coupled to ends of a plurality of wires 650 of the test structure 640. Rather than using a MEMS rigid probe device 578 as in the previous embodiment, shown in FIG. 10, an interposer 680 is coupled to ends of the wires 650 protruding from the ST plate 642 in the probe region 641, and the conductive springs 688 of the interposer 680 are used as probe tips 670 in the probe region 641. The compliance mechanism 660 comprising an elastomer plate 654 (or springs 372 as shown in FIG. 6 or stiffness controllable frame structure 474 as shown in FIG. 8) provides a first amount 668a of the compliance and the interposer 680 provides a second amount 668b of compliance for the test structure 640, in this embodiment.

The pattern of the probe tips 270/370/470/570/670 may comprise a substantially rectangular or square array in some embodiments, to make electrical contact with semiconductor devices 210 (see FIG. 1) or integrated circuits having a ball grid array or other patterns. Alternatively, the patterns of the probe tips 270/370/470/570/670 of embodiments of the present disclosure may comprise other configurations, for example. The test structures 240/340/440/540/640 may be used to test integrated circuits such as micro bump chips, through silicon via (TSV) chips, 3D ICs, and other semiconductor devices packaged in fine-pitched array packages, as examples.

Embodiments of the present disclosure include the test structures 240/340/440/540/640 shown and described herein. Embodiments of the present disclosure also include methods of manufacturing the test structures 240/340/440/540/640. For example, in accordance with one embodiment, a method of manufacturing a test structure 240/340/440/540/640 includes providing an ST plate 242/342/442/542/642, coupling a first plate 244/344/444/544/644 to the ST plate 242/342/442/542/642, and inserting a plurality of wires 250/350/450/550/650 into and through the ST plate 242/342/442/542/642. Ends of the plurality of wires 250/350/450/550/650 extend from the ST plate 242/342/442/542/642. An adhesive 252/352/452/552/652 is applied to the ST plate 242/342/442/542/642 and the plurality of wires 250/350/450/550/650 in a central region of the ST plate 242/342/442/542/642, and a compliance mechanism 260/360/460/560/660 is disposed over the first plate 244/344/444/544/644. A second plate 256/356/456/556/656 is disposed over the compliance mechanism 260/360/460/560/660, and a PCB 262/362/462/562/662 is coupled to the second plate 256/356/456/556/656. The method includes coupling an outer edge of the ST plate 242/342/442/542/642 to the PCB 262/362/462/562/662 through through-holes in the first plate 244/344/444/544/644, the second plate 256/356/456/556/656, and the compliance mechanism 260/360/460/560/660, and forming a probe region 241/341/441/541/641 proximate ends of the plurality of wires 250/350/450/550/650 that extend from the ST plate 242/342/442/542/642. End portions of the plurality of wires 250/350/450/550/650 proximate the probe region 241/341/441/541/641 comprise an integral part of the probe region 241/341/441/541/641 and in some embodiments comprise probe tips 270/370/470.

Embodiments of the present disclosure also include testing semiconductor devices 210 using the test structures 240/340/440/540/640 described herein. For example, in one embodiment, a method of testing a semiconductor device 210 includes providing a test structure 240/340/440/540/640, the test structure 240/340/440/540/640 including a PCB 262/362/462/562/662, a probe region 241/341/441/541/641, a compliance mechanism 260/360/460/560/660 disposed between the PCB 262/362/462/562/662 and the probe region 241/341/441/541/641, and a plurality of wires 250/350/450/550/650 coupled between the PCB 262/362/462/562/662 and the probe region 241/341/441/541/641, wherein end portions of the plurality of wires 250/350/450/550/650 proximate the probe region 241/341/441/541/641 comprise an integral part of the probe region 241/341/441/541/641. The test method includes providing the semiconductor device 210, connecting the probe region 241/341/441/541/641 of the test structure 240/340/440/540/640 to contacts of the semiconductor device 210, and testing the semiconductor device 210. The compliance mechanism 260/360/460/560/660 provides compliance in a direction substantially perpendicular to the semiconductor device 210 while connecting the probe region 241/341/441/541/641 of the test structure 240/340/440/540/640 to the contacts of the semiconductor device 210 and/or while testing the semiconductor device 210.

Advantages of embodiments of the disclosure include providing test structures 240/340/440/540/640 for semiconductor devices 210 that are capable of fine pitch and high density probe testing. The test structures 240/340/440/540/640 are reliable and have efficient assembly methods to ensure electrical and mechanical probing. The compliance mechanisms 260/360/460/560/660 provide or absorb compliance during probing and testing semiconductor devices 210 and integrated circuits, without requiring the use of a separate probe head. Probe regions 241/341/441/541/641 having fine pitch arrays of 50 µm or less may be manufactured utilizing embodiments of the present disclosure. The manufacturing costs are low and the lead time for building the test structures 240/340/440/540/640 is short. The probe contact behavior regarding stiffness and deformation direction is easily adjustable. The novel test structures 240/340/440/540/640 are not easily damaged during assembly and have minimal hole drilling limitations.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A test structure for semiconductor devices, the test structure comprising:
    a compliance mechanism disposed between a printed circuit board (PCB) and a probe region;
    a fix ring coupled to the PCB;
    an aperture extending completely through the PCB and the compliance mechanism, the aperture having a diameter in a first plane parallel to a major surface of the PCB, wherein a width of the probe region is fully disposed within the diameter of the aperture, wherein the width of the probe region is in a second plane parallel to the major surface of the PCB;
    a plurality of wires coupled to the PCB, the plurality of wires extending from the PCB to the probe region, the plurality of wires disposed between the PCB and the probe region;
    wire material of end portions of the plurality of wires comprising probe tips; and
    an adhesive disposed in the aperture over and contacting a space transformer plate, wherein a sidewall of the aperture that is closest to the adhesive does not contact the adhesive, the sidewall of the aperture extending from the space transformer plate to the fix ring.

2. The test structure according to claim 1, wherein the compliance mechanism comprises an elastomer plate.

3. The test structure according to claim 1, wherein the compliance mechanism comprises at least one spring member.

4. The test structure according to claim 3, wherein the at least one spring member comprises a constant pitch, a variable pitch, a cylindrical shape, a conical shape, an hourglass shape, a barrel shape, or a combination thereof.

5. The test structure according to claim 1, wherein the compliance mechanism comprises a stiffness controllable frame structure.

6. The test structure according to claim 1, further comprising a micro-electromechanical system (MEMS) rigid probe device coupled to the probe tips.

7. The test structure according to claim 6, further comprising an interposer disposed between the MEMS rigid probe device and the probe tips.

8. The test structure according to claim 7, wherein the compliance mechanism provides a first amount of compliance for the test structure and wherein the interposer provides a second amount of compliance for the test structure.

9. The test structure according to claim 1, further comprising an interposer coupled to the probe tips.

10. The test structure according to claim 9, wherein the interposer comprises a pliable material layer and a plurality of conductive springs disposed within the pliable material layer.

11. The test structure according to claim 10, wherein the compliance mechanism provides a first amount of compliance for the test structure and wherein the interposer provides a second amount of compliance for the test structure.

12. The test structure according to claim 1, wherein the plurality of wires extend through the aperture and the adhesive.

13. The test structure according to claim 1, further comprising a metal plate disposed between the compliance mechanism and the PCB.

14. A test structure for semiconductor devices, the test structure comprising:
    a space transformer (ST) plate;
    a first plate coupled to the ST plate;
    a second plate proximate to the first plate, wherein the first plate is disposed between the second plate and the ST plate;
    a compliance mechanism disposed between the first plate and the second plate;
    a printed circuit board (PCB) coupled to the second plate, wherein the second plate is disposed between the PCB and the compliance mechanism, and wherein an outer edge of the ST plate is fixedly attached to the PCB through through-holes in the first plate, the second plate, and the compliance mechanism, wherein a virtual straight line that extends from the ST plate to the PCB sequentially passes through the ST plate, the first plate, the compliance mechanism, the second plate, and the PCB;
    a plurality of wires coupled between the PCB and the ST plate, the plurality of wires extending over a side of the PCB facing away from the ST plate and through an aperture extending through the PCB, the second plate, the compliance mechanism, and the first plate, the plurality of wires further extending through the ST plate;
    a probe region proximate to ends of the plurality of wires, wherein wire material of end portions of the plurality of wires proximate to the probe region comprises probe tips, and wherein wire material of end portions of the plurality of wires proximate to the probe region are adapted to make electrical contact with contacts of a semiconductor device for testing; and
    an adhesive disposed within the aperture and contacting a surface of the ST plate, wherein the adhesive does not contact a sidewall of the aperture, the sidewall of the aperture sequentially extending from the ST plate, along a sidewall of the first plate, along a sidewall of the compliance mechanism, and along a sidewall of the second plate.

15. The test structure according to claim 14, further comprising a plurality of guide pins coupled to the ST plate and extending through through-holes in the first plate, the compliance mechanism, and the second plate.

16. The test structure according to claim 14, wherein all surfaces of the PCB, the second plate, the compliance mechanism, and the first plate are free from the adhesive.

17. The test structure according to claim 14, further comprising a micro-electromechanical system (MEMS) rigid probe device coupled to the probe tips.

18. A method of testing a semiconductor device, the method comprising:
    providing a test structure, the test structure comprising a printed circuit board (PCB), a probe region, a compliance mechanism disposed between the PCB and the probe region, a space transformer (ST) plate disposed between the probe region and the compliance mechanism, a first metal plate disposed between the compliance mechanism and the PCB, a second metal plate disposed between the ST plate and the compliance mechanism, the PCB and the compliance mechanism fixedly attached to the ST plate by attachment elements extending through the PCB and the compliance mechanism, and a plurality of wires coupled between the PCB and the probe region, wherein the plurality of wires extends above a surface of the PCB facing away from the compliance mechanism and through an aperture extending completely through the PCB and the compliance mechanism, the plurality of wires further extending through a region of the ST plate, wherein wire material of end portions of the plurality of wires proximate the probe region comprise probe tips, wherein an adhesive is disposed in the aperture contacting the ST plate, wherein the adhesive does not contact a sidewall of the aperture, the sidewall of the aperture sequentially extending from the ST plate, along a sidewall of the first metal plate, along a sidewall of the compliance mechanism, and along a sidewall of the second metal plate;

providing a semiconductor device, the semiconductor device comprising contacts;

connecting wire material of end portions of the plurality of wires proximate the probe region to the contacts of the semiconductor device; and testing the semiconductor device, wherein the compliance mechanism provides compliance in a direction substantially perpendicular to the semiconductor device while connecting the probe tips of the test structure to the contacts of the semiconductor device and while testing the semiconductor device.

19. The method according to claim 18, wherein testing the semiconductor device comprises testing a single die of a semiconductor wafer, before or after singulating a plurality of die from the semiconductor wafer.

20. The method according to claim 19, wherein testing the semiconductor device comprises simultaneously testing a plurality of die of a semiconductor wafer, before or after singulating a plurality of die from the semiconductor wafer.

\* \* \* \* \*